(12) United States Patent
Johnson

(10) Patent No.: US 6,928,629 B2
(45) Date of Patent: Aug. 9, 2005

(54) SYSTEM AND METHOD FOR PARSING HDL EVENTS FOR OBSERVABILITY

(75) Inventor: Tyler James Johnson, Plano, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/453,720

(22) Filed: Jun. 3, 2003

(65) Prior Publication Data

US 2004/0225974 A1 Nov. 11, 2004

Related U.S. Application Data

(60) Provisional application No. 60/469,350, filed on May 9, 2003.

(51) Int. Cl.[7] .............................................. G06F 17/50
(52) U.S. Cl. ..................... 716/4; 716/1; 716/5; 716/6; 714/25
(58) Field of Search ..................... 716/1, 4, 5; 717/146; 703/13, 16, 17

(56) References Cited

U.S. PATENT DOCUMENTS

| | | | | |
|---|---|---|---|---|
| 5,437,037 A | * | 7/1995 | Furuichi | 717/146 |
| 6,466,898 B1 | * | 10/2002 | Chan | 703/17 |
| 6,742,166 B2 | * | 5/2004 | Foster et al. | 716/4 |
| 2003/0023941 A1 | * | 1/2003 | Wang et al. | 716/4 |
| 2003/0182642 A1 | * | 9/2003 | Schubert et al. | 716/4 |
| 2004/0006751 A1 | * | 1/2004 | Kawabe et al. | 716/4 |

OTHER PUBLICATIONS

Vo et al., "Scan parallel loading in VHDL", Mar. 16–19, 1998, Verilog HDL conference and VHDL International Users Forum, IVC/VIUF, pp.: 178–187.*

Alves da Silva et al., "A pattern analysis approach for topology determination, bad data correction and missing measurement estimation in power systems", Oct. 15–16, 1990, Power Symposium, Proceedings of the 22 Annual North American, pp.:363 372.*

Levitt et al., "Testability, debuggability, and manufacturability features of the UltraSPARC–I microprocessor", Oct. 21–25, 1995, Test Conference, 1995. Proceedings., International, pp.: 157–166.*

Bart Vermeulen and Sandeep Kumar Goel; "Design for Debug: Catching Design Errors in Digital Chips"; IEEE Design & Test of Computers; May–Jun. 2002; pp. 37–45.

* cited by examiner

*Primary Examiner*—A. M. Thompson
*Assistant Examiner*—Helen Rossoshek

(57) ABSTRACT

In one embodiment, the invention is directed to a method of processing a database comprising information regarding hardware design language ("HDL") events occurring during a simulation of a hardware design. The method comprises identifying in the database all HDL events comprising observability events; obtaining from each of the identified observability HDL events information pertaining to a signal driving the identified observability HDL event observed on an observability bus; and creating a data structure comprising a plurality of entries, wherein each of the entries corresponds to one of the signals observed on the observability bus and contains signal information pertaining to the one of the observed signals.

26 Claims, 5 Drawing Sheets

SYSTEM AND METHOD FOR PARSING HDL EVENTS FOR OBSERVABILITY

PRIORITY UNDER 35 U.S.C. §119(e) & 37 C.F.R. §1.78

This nonprovisional application claims priority based upon the following prior United States provisional patent application entitled: "System And Method For Parsing HDL Events," application Ser. No. 60/469,350, filed May 9, 2003, in the name(s) of Tyler J. Johnson, which is hereby incorporated by reference.

CROSS-REFERENCE TO RELATED APPLICATIONS

This application is related to U.S. patent application Ser. No. 10/402,092, filed Mar. 28, 2003, entitled A BUS INTERFACE MODULE; U.S. patent application Ser. No. 10/402,628, filed Mar. 28, 2003, entitled SYSTEM AND METHOD FOR USING A DEBUG BUS AS A CAPTURE BUFFER; U.S. patent application Ser. No. 10/402,122, filed Mar. 28, 2003, entitled SYSTEM AND METHOD FOR VERIFYING HDL EVENTS; and U.S. patent application Ser. No. 10/402,034, filed Mar. 28, 2003, entitled AN INTEGRATED CIRCUIT; U.S. patent application Ser. No. 10/453,103, filed Jun. 3, 2003, entitled POST-SILICON TEST COVERAGE VERIFICATION; and U.S. patent application Ser. No. 10/453,129, filed Jun. 3, 2003, entitled GENERAL PURPOSE DELAY LOGIC, all of which are hereby incorporated by reference in their entirety.

BACKGROUND

The increasing complexity of system designs, increased investment required due to this complexity, and shortened product cycles have presented significant challenges to post-silicon design verification of chipsets. This is especially true with respect to high-end cache coherent non-uniform memory access ("ccNUMA") chipsets where systems can be extremely large and complex. Processor post-silicon verification is typically focused on electrical verification at least as much as functional verification due to the large amount of full custom design. Chipsets present a different challenge due to the large number of cells of which they are comprised. Additionally, due to the sheer number of buses, internal bus arbitration, cache coherency control, queue arbitration, etc., in a large ccNUMA server, post-silicon functional verification of such a chipset consumes a greater amount of resources with respect to electrical verification than processors typically consume. Internal observability, while relatively simple in pre-silicon verification, poses a major obstacle to debug and functional test coverage.

Determining when system verification is complete is a second major obstacle to completing post-silicon verification in a time-effective manner. While pre-silicon simulation-based testing depends significantly on labor intensive directed and pseudo-random testing, post-silicon testing has historically depended on observing system operations that imply correct behavior.

Performing post-silicon design verification is an industry standard practice that facilitates exposure of bugs not typically uncovered in pre-silicon verification. Typical post-silicon bugs discovered include those that are manifested after long or at-speed operation of the system, those resulting due to incorrect modeling of hardware and firmware interfaces, those resulting from Register Transfer Language ("RTL") errors that escaped pre-silicon detection, and those resulting from incorrect mapping of RTL-to-silicon (synthesis/physical bugs). Accepted methods of exercising systems to expose post-silicon bugs include running operating systems and software applications targeted for the final system, creating specific directed software tests that stress different portions of the system, and running software tests that create random system operations.

Real-time observability ("RTO") refers to the ability to monitor and capture internal signals in real time either on- or off-chip. While internal signal observability features have been available in some field programmable gate array ("FPGA") architectures and application specific integrated circuits ("ASICs"), they have typically been of limited scope. Limiting factors have been silicon area, wiring constraints, and I/O limitations. In addition, observability features have traditionally been used for debug and not functional test coverage.

Once an IC is designed, with or without any internal signal observability capabilities, there remains a need for the design to be tested. Verilog HDL is a Hardware Description Language ("HDL"). An HDL is a language used to describe a digital system, for example, a computer or a component of a computer. One might describe a digital system at several levels. For example, an HDL might describe the layout of wires, resistors, and transistors on an IC chip; i.e., at the switch level. In contrast, one might describe the logic gates and flip-flops in a digital system, i.e., the gate level. An even higher level describes the registers and transfers of vectors of information between registers. This is called the Register Transfer Level ("RTL"). Verilog HDL supports all of these levels.

Verilog is a discrete event time simulator. As will be recognized by those of ordinary skill in the art, in Verilog HDL, the execution of a procedural statement can be triggered on the occurrence of a named event. A record of the occurrence of events during a simulation is maintained as an "event log" in an "event log file". A primary use of HDLs is the simulation of a design before the design is committed to fabrication. While several HDLs exist, none is known to support HDL events in the context of real-time observability of a digital system.

SUMMARY

In one embodiment, the invention is directed to a method of processing a database comprising information regarding hardware design language ("HDL") events occurring during a simulation of a hardware design. The method comprises identifying in the database all HDL events comprising observability events; obtaining from each of the identified observability HDL events information pertaining to a signal driving the identified observability HDL event observed on an observability bus; and creating a data structure comprising a plurality of entries, wherein each of the entries corresponds to one of the signals observed on the observability bus and contains signal information pertaining to the one of the observed signals.

DETAILED DESCRIPTION OF THE DRAWINGS

Figure 1:
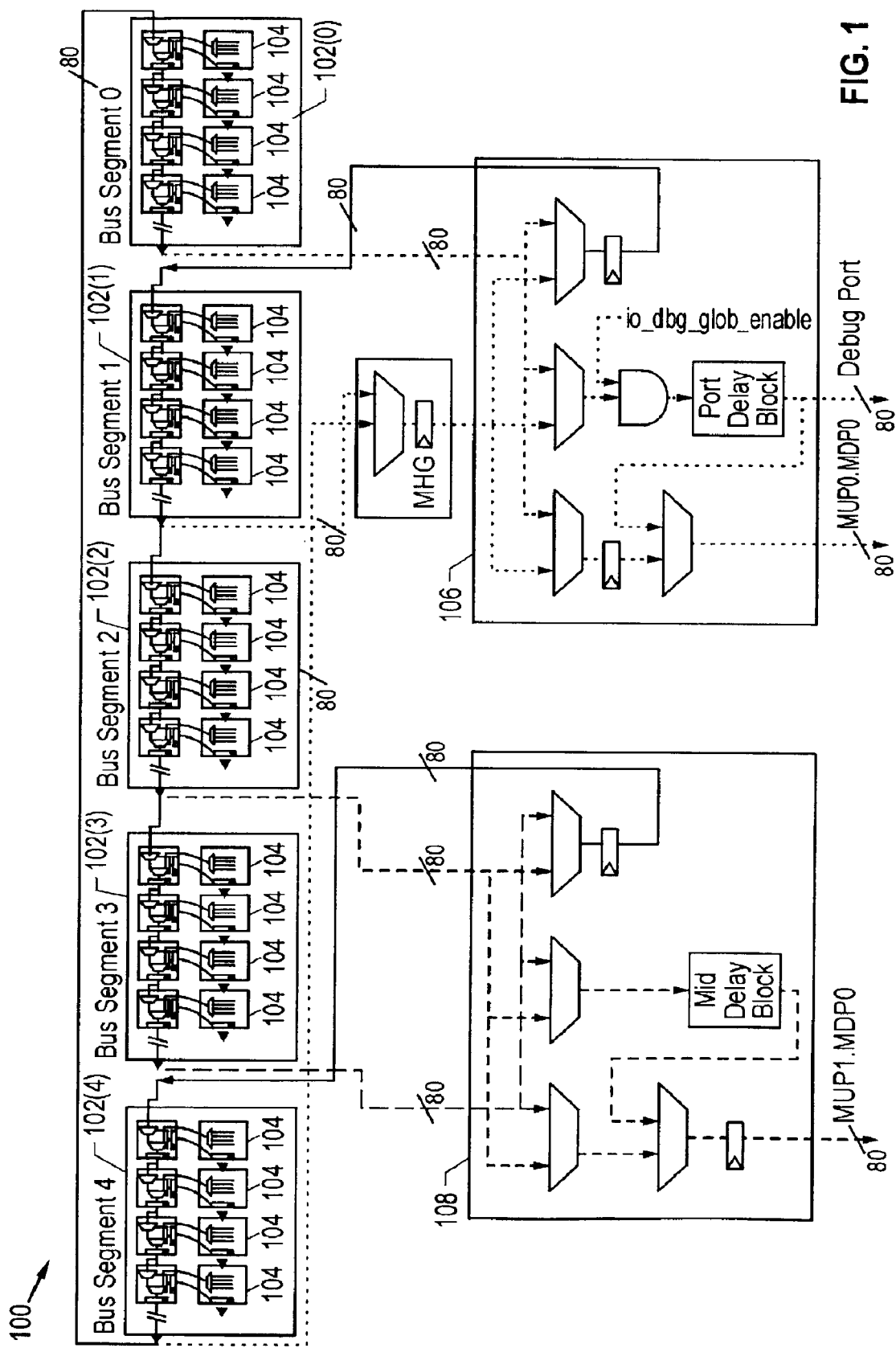
FIG. 1 is a block diagram of a debug bus of one embodiment.

In the drawings, like or similar elements are designated with identical reference numerals throughout the several views thereof, and the various elements depicted are not necessarily drawn to scale.

As illustrated in FIG. 1, in accordance with one embodiment, a debug bus 100 comprises a plurality of bus segments 102(0)–102(4) interconnected in a serial ring and runs at the core clock speed of an IC, e.g., an ASIC, in which the bus is implemented. In one implementation, the debug bus 100 is 80-bits wide; however, in general, the width of the debug bus is consistent with device pin constraints. Moreover, although the illustrated embodiment employs only five bus segments 102(0)–102(4), it will be appreciated that greater or fewer than five bus segments may be implemented as necessary for providing appropriate logical and physical partitioning.

Each bus segment 102(0)–102(4) comprises several access points 104 at which data from surrounding logic is MUXed onto the debug bus 100. As will be described in greater detail below with reference to FIGS. 3 and 4, each access point 104 comprises a standard logic block with a proprietary MUX structure that drives debug data into the access point, which subsequently drives the data onto the debug bus 100.

As illustrated in FIG. 1, two observability ports 106, 108 are defined. In one embodiment, one of the ports, i.e., port 106, is a dedicated debug port. The other port, i.e., port 108, is loaded with functional signals. The debug bus 100 contains debug data that drives both of these ports 106, 108. In one embodiment, the debug port 106 has 80 data pins, plus four strobe pins that are single pumped, with the intention that the port 106 be connected directly to a logic analyzer (not shown).

As previously indicated, the debug port 106 is fed directly from the debug bus 100, which runs at core clock speed and connects the bus segments 106 in a serial ring. The debug bus 100 is segmented so that for any of a plurality of functional areas of an IC in which the bus is implemented, packets to and from the area can be observed in addition to 80 bits of internal state data. Additional details regarding implementation and operation of the debug bus 100 and ports 102, 104 are provided in commonly-assigned, co-pending U.S. patent application Ser. No. 10/402,034, filed Mar. 28, 2003, entitled AN INTEGRATED CIRCUIT, which has been incorporated by reference in its entirety hereinabove.

Figure 2:
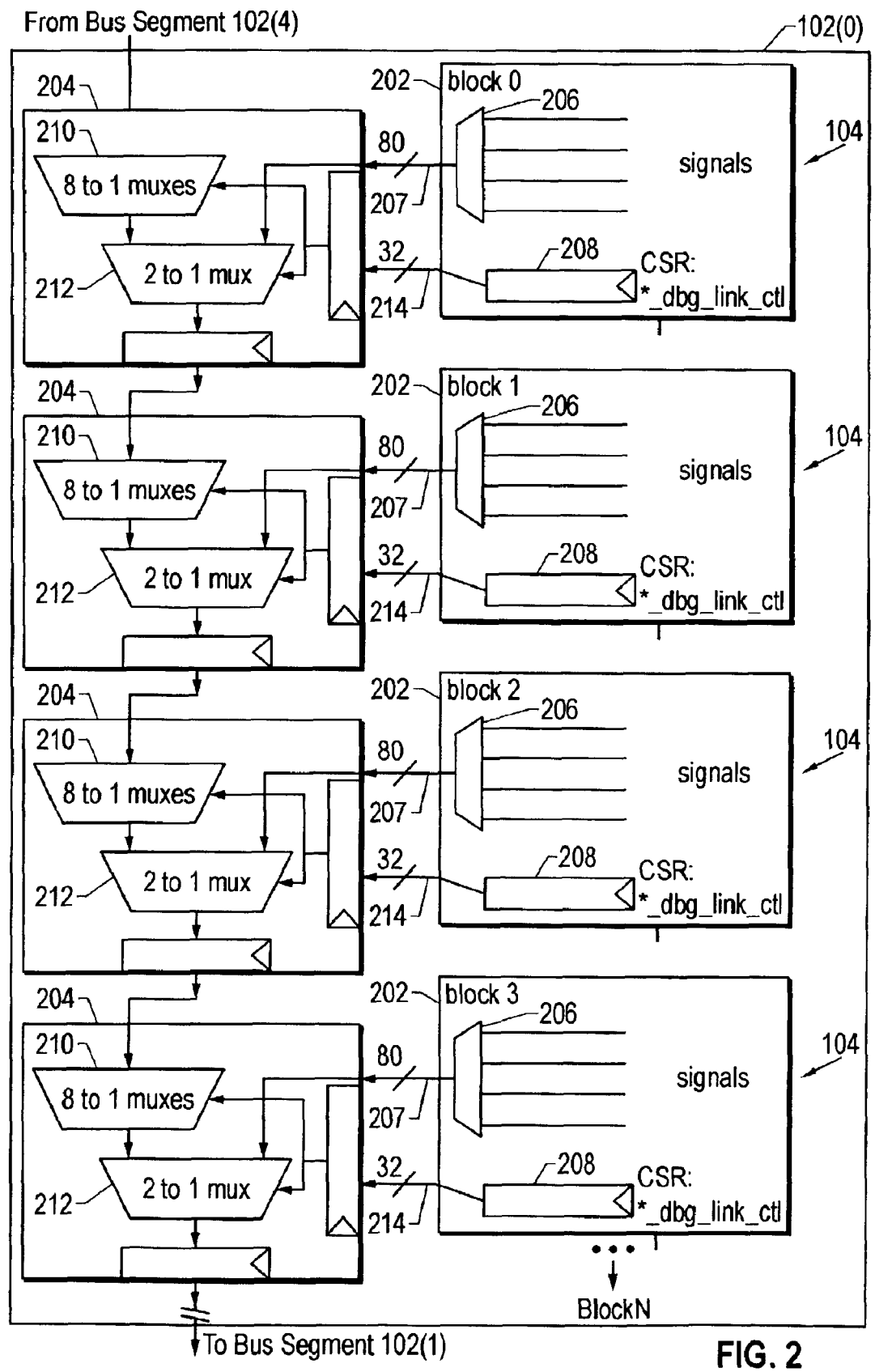
FIG. 2 is a block diagram of a bus segment of the debug bus of FIG. 1.

FIG. 2 is a more detailed block diagram of the bus segment 102(0) of the debug bus 100 illustrated in FIG. 1. As illustrated in FIG. 2, the bus segment 102(0) includes a plurality of access points 104. It should be noted that although only four access points 104 are shown, each bus segment 102(0)–102(4) may comprise greater or fewer access points as necessitated by the number of signals that must be handled by the bus segment.

As shown in FIG. 2, each access point 104 includes a local data intake section 202 and a corresponding debug bus interface block ("DBIB"), or Bus Interface Module, 204 connected thereto. At each access point 104, up to 80 bits of data from surrounding logic ("dbug_read_bus") is provided to the DBIB 204 thereof via a MUX 206 along a bus 207. A control and status register ("CSR") 208 provides a 32-bit MUX select signal ("*_dbg$_{link}$_ctl") to MUXes 210, 212, of the corresponding DBIB 204 for purposes that will be described in greater detail below via a bus 214.

Figure 3:
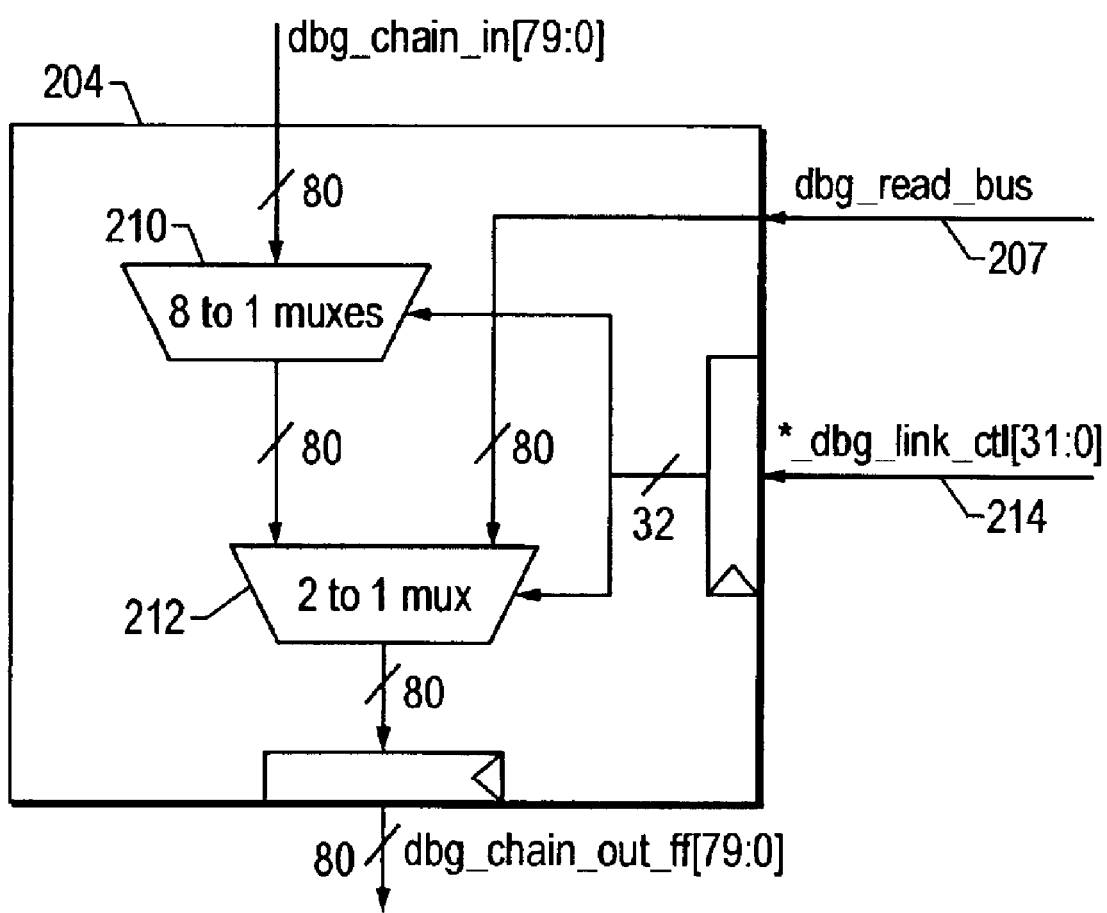
FIG. 3 is a block diagram of a standard logic block used to implement the bus segment of FIG. 2.

FIG. 3 is a more detailed block diagram of one of the DBIBs 204 of FIG. 2. In one embodiment, the debug bus 100 is logically divided into eight 10-bit blocks. Each DBIB 204 can move and/or replicate incoming debug bus data ("dbg_chain_in") from the previous DBIB in the chain in these 10-bit blocks to make room for incoming data ("dbg_read_bus") from the corresponding local data intake section 202, if necessary, and pass the newly configured data ("dbg_chain_out") to the next DBIB 204 in the chain. Generally, each DBIB 204 performs the following three functions: (1) it passes data on from the previous access point, (2) it moves 10-bit blocks of data from the previous access point to other ranges of the debug bus, allowing for more efficient bandwidth utilization; and (3) it MUXes in data from surrounding logic in 10-bit chunks.

As previously indicated, to make MUXing of data manageable, the debug bus 100 is logically divided into eight 10-bit blocks, each of which can be individually manipulated. Further, each access point 104 registers data from the previous access point, rearranges the data from previous access point in 10-bit blocks as specified by the corresponding CSR control signal ("*_dbg_link_ctl"), and MUXes in local data to be passed on to the next access point. Accordingly, the *_dbg_link_control signal functions as a MUX select signal.

In accordance with features of one embodiment, an HDL event is defined that contains a functional signal name, a MUX select configuration required to see the functional signal at the observability port 106 (FIG. 1), and the bit position of the functional signal on the observability port. An exemplary event macro for defining such an event, designated "EVENT_DBG_C", is set forth below:

EVENT_DBG_C(<ck>,<mux_sel>,<constant>,<signal_name>,<offset>,<slot >,<event_ID>);

<ck> The core clock.

<mux_sel> The bits in *_dbg_link_ctl required to enable the signal identified by <signal_name>. This field can be 1 to 64 bits. This will be a variable.

<constant> When <mux_sel>=<constant>, the event triggers. This field is also 1 to 64 bits. This will be a constant. Include everything that is not a "don't care", including zeros.

<signal_name> The signal (variable) going to the debug bus.

Do not zero fill.

The field of the signal identified by <signal_name> must be aligned to a block boundary (unless a non-zero <offset> is specified)

Signals that span multiple blocks are OK, but the blocks must be contiguous and enabled by the same MUX select bits.

<offset> The offset from a 10-bit block boundary (hex value 0 to 9) of the signal identified by <signal_name>. Most signals should be aligned on a 10-bit block boundary and therefore have a 0 in this field.

<slot> An 8-bit mask that indicates what block or blocks are written to for the signal identified by <signal_name> (constant)

Blocks must be contiguous.

<event_ID> The event ID. This MUST BE absolutely unique. Use of block as a prefix (e.g., pin_dbg_block0) is suggested.

Event Macro

Figure 4:
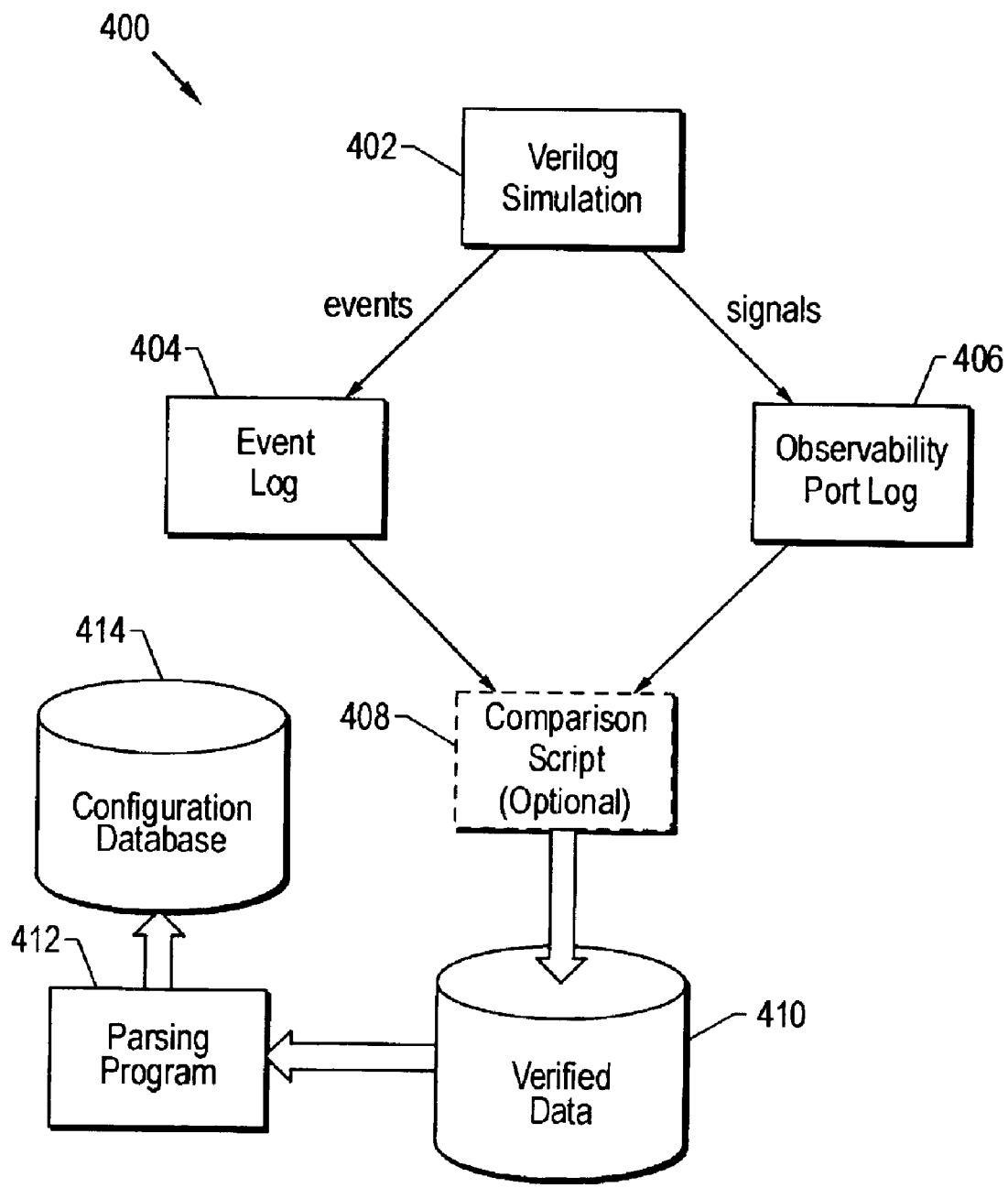
FIG. 4 represents a simulation run performed in accordance with one embodiment.

FIG. 4 represents a simulation run 400 performed in accordance with one embodiment. As shown in FIG. 4, during the simulation run 400, a Verilog HDL simulation 402 of the debug bus 100 (FIG. 1) is performed. During the simulation 402, each time the conditions are such that a signal should be active on the debug bus (i.e., when <mux_sel>=<constant>), the EVENT_DBUG_C fires and the occurrence of the event, including the signal name, placement (i.e., offset and slot), and the value of the MUX select signal, are noted in an event log 404. Simultaneously, the value of the signal is noted in an observability port log 406.

Once the simulation is complete, the two logs 404, 406 are compared, either manually or using a computer program or script 408 designed for that purpose, to determine whether the data from the functional signals appears on the observability port in the right location with all of the right values as indicated by the event log 404. In other words, the entries in the event log 404 indicate that conditions were proper for the named signal to have appeared at the observability port at the specified location; therefore, the signal should show up at the corresponding location in the observability port log 406. If this is not the case, that is, if the expected signal does not appear at the observability port, as indicated in the observability port log 406, a connectivity problem may be indicated.

The thus verified data is stored in a database 410. In accordance with one embodiment, as will be described in greater detail with reference to FIG. 5, a parsing program, or script, 412 generates a configuration database 414 therefrom. The configuration database 414 contains all of the information necessary to configure the debug bus 100; in particular, the configuration database 414 contains the data necessary for configuring the MUXes 206, 210, 212, of the debug bus 100. In this manner, each event itself is used to define its own interface.

Figure 5:
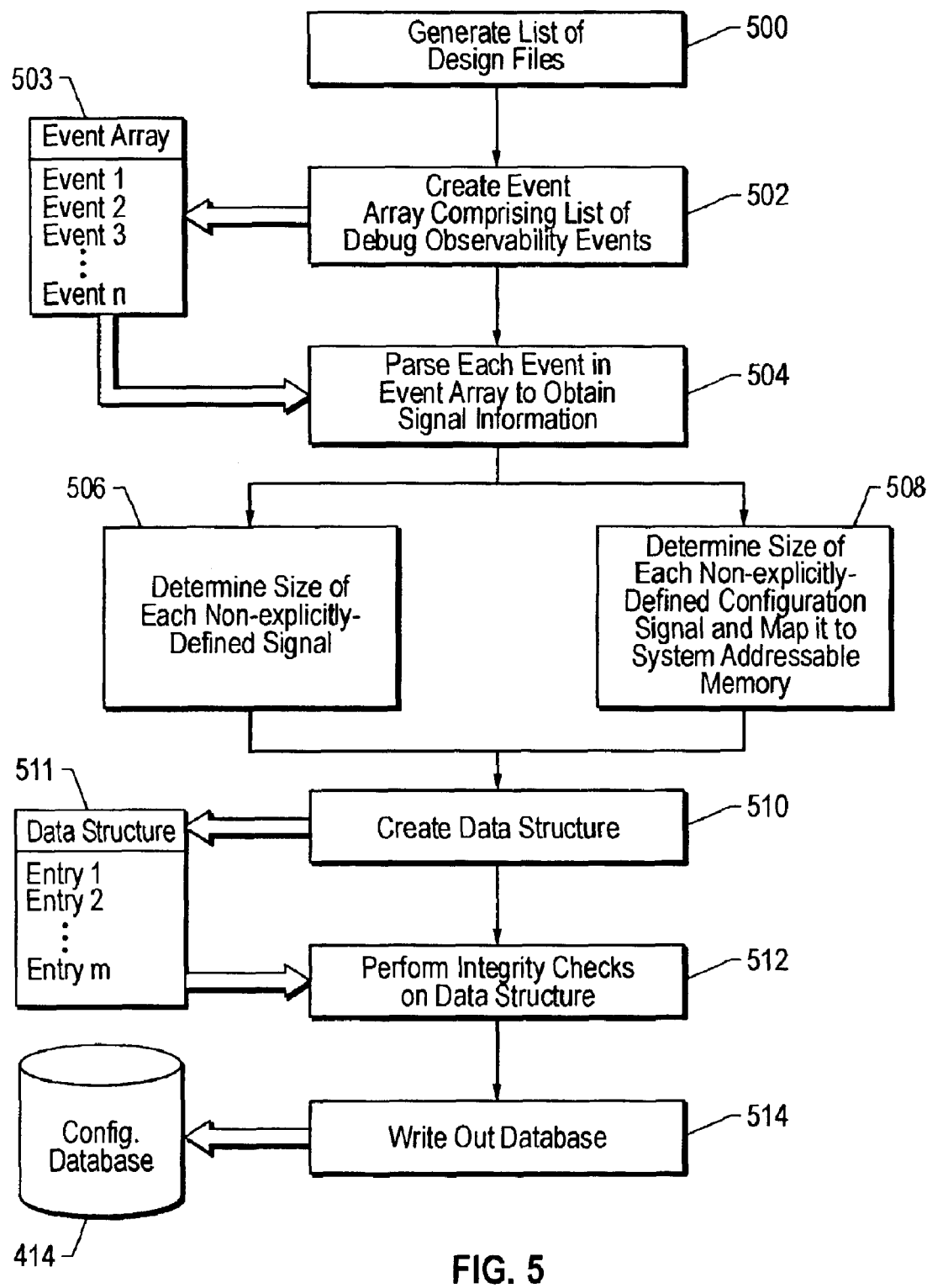
FIG. 5 is a flowchart of the operation of one embodiment of a program for parsing HDL events for observability.

FIG. 5 is a flowchart of the operation of the parsing program 412. In step 500, a file list of design files is generated by examining the directory structure and file types of the database 410. In step 502, the program 412 opens each of the listed files and copies each debug observability event into a one-dimensional "event array" 501. Upon completion of step 502, in step 504, each event in the event array is parsed to obtain (1) the list of signals driving the event; (2) the configuration bits for making the listed signals visible; (3) the configuration signal for making the listed signals visible; and (4) the name of the design sub-block (i.e., the portion of the ASIC) from which the signal originates. Once all of the events in the event array are parsed as described in step 504, in step 506, for each signal that is not explicitly defined, the size of the signal is determined by examining the source file thereof or any referenced include files. Concurrently, in step 508, for each configuration signal that is not explicitly defined, the size of the signal is determined by examining the source file thereof or any referenced include file. Additionally, a mapping to system-addressable memory (not shown) is obtained for each configuration signal and the configuration signal name is converted to a corresponding system-addressable memory location.

In step 510, a data structure 511 in which there is an entry for each signal (rather than each event, as before) is created. Included in each entry of the data structure 511 are the memory locations and values and sub-block names for the signal, as well as any comments extracted from the event from which the signal was recovered. In step 512, data integrity checks, such as boundary/overlap tests and conflict tests, are performed on the entries in the data structure 511. In step 514, the database 414 (FIG. 4) is written out.

As a result of the steps illustrated in FIG. 5, the configuration database 414 comprises all of the data necessary for configuring the debug bus 100 and that data has been tested and verified as accurate.

An implementation of the invention described herein thus provides system and method for parsing HDL events to generate a database for enabling real-time observability in an IC. The embodiments shown and described have been characterized as being illustrative only; it should therefore be readily understood that various changes and modifications could be made therein without departing from the scope of the present invention as set forth in the following claims. For example, while the embodiments are described with reference to an ASIC, it will be appreciated that the embodiments may be implemented in other types of ICs, such as custom chipsets, Field Programmable Gate Arrays ("FPGAs"), programmable logic devices ("PLDs"), generic array logic ("GAL") modules, and the like. Additionally, the embodiments described herein may be implemented with HDLs other than Verilog HDL. Moreover, although the embodiments are described with reference to debug data, it will be recognized that they are applicable to verifying other types of HDL events and corresponding data as well.

Accordingly, all such modifications, extensions, variations, amendments, additions, deletions, combinations, and the like are deemed to be within the ambit of the present invention whose scope is defined solely by the claims set forth hereinbelow.

What is claimed is:

1. A method of processing a database comprising information regarding hardware design language ("HDL") events occurring during a simulation of a hardware design, the method comprising:

identifying in the database all HDL events comprising observability events;

obtaining from each of the identified observability HDL events information pertaining to a signal driving the identified observability HDL event observed on an observability bus; and creating a data structure comprising a plurality of entries, wherein each of the entries corresponds to one of the signals observed on the observability bus and contains signal information pertaining to the one of the observed signals, the data structure being operable for configuring the observability bus in order to select signals from different portions of the hardware design.

2. The method of claim 1 further comprising performing integrity checks on the data structure.

3. The method of claim 2 wherein the integrity checks comprise boundary and overlap tests.

4. The method of claim 2 wherein the integrity checks comprise conflict tests.

5. The method of claim 2 further comprising, subsequent to the performing integrity checks on the data structure, writing a configuration database comprising information for configuring the observability bus.

6. The method of claim 1 wherein the signal information comprises, for each signal, a name of the signal.

7. The method of claim 1 wherein the signal information comprises, for each signal, configuration bits for making the signal visible.

8. The method of claim 1 wherein the signal information comprises, for each signal, a name of a design sub-block from which the signal originates.

9. The method of claim 1 wherein the signal information comprises, for each signal, a configuration signal for making the signal visible.

10. The method of claim 9 further comprising, for each non-explicitly-defined configuration signal:

determining a size of the configuration signal; and mapping the configuration signal to a system-addressable memory location.

11. The method of claim 1 further comprising, for each non-explicitly-defined signal, determining a size of the signal.

12. A method of generating a configuration database for configuring an observability bus of a design, the method comprising:

identifying in a database comprising information regarding events occurring during a simulation of a design all events comprising observability events;

obtaining from each of the identified observability events information pertaining to a signal driving the identified observability HDL event observed on an observability bus;

creating a data structure comprising a plurality of entries, wherein each of the entries corresponds to one of the signals observed on the observability bus and contains signal information pertaining to the one of the observed signals, the data structure being operable for configuring the observability bus in order to select signals from different portions of the design; and writing a configuration database comprising information for configuring the observability bus.

13. The method of claim 12 further comprising performing integrity checks on the data structure prior to writing the configuration database.

14. The method of claim 13 wherein the integrity checks comprise boundary and overlap tests.

15. The method of claim 13 wherein the integrity checks comprise conflict tests.

16. The method of claim 12 wherein the signal information is selected from a group consisting of, for each signal, a name of the signal, configuration bits for making the signal visible, a configuration signal for making the signal visible, and a name of a design sub-block from which the signal originates.

17. The method of claim 16 further comprising, for each non-explicitly-defined configuration signal:

determining a size of the configuration signal; and mapping the configuration signal to a system-addressable memory location.

18. The method of claim 12 further comprising, for each non-explicitly-defined signal, determining a size of the signal.

19. A system for processing a database comprising information regarding hardware design language ("HDL") events occurring during a simulation of a hardware design, the system comprising:

means for identifying in the database all HDL events comprising observability events;

means for obtaining from each of the identified observability HDL events information pertaining to a signal driving the identified observability HDL event observed on an observability bus; and means for creating a data structure comprising a plurality of entries, wherein each of the entries corresponds to one of the signals observed on the observability bus and contains signal information pertaining to the one of the observed signals, the data structure being operable for configuring the observability bus in order to select signals from different portions of the hardware design.

20. The system of claim 19 further comprising means for performing integrity checks on the data structure.

21. The system of claim 20 wherein the integrity checks comprise boundary and overlap tests.

22. The system of claim 20 wherein the integrity checks comprise conflict tests.

23. The system of claim 19 further comprising means for writing a configuration database comprising information for configuring the observability bus subsequent to performing integrity checks on the data structure.

24. The system of claim 19 wherein the signal information, for each signal, is selected from a group consisting of a name of the signal, configuration bits for making the signal visible, a configuration signal for making the signal visible, and a name of a design sub-block from which the signal originates.

25. The system of claim 24 further comprising, for each non-explicitly-defined configuration signal:

means for determining a size of the configuration signal; and means for mapping the configuration signal to a system-addressable memory location.

26. The system of claim 19 further comprising means for determining a size of each signal comprising a non-explicitly-defined signal.

* * * * *

UNITED STATES PATENT AND TRADEMARK OFFICE
CERTIFICATE OF CORRECTION

PATENT NO.         : 6,928,629 B2                                              Page 1 of 1
APPLICATION NO. : 10/453720
DATED              : August 9, 2005
INVENTOR(S)        : Tyler James Johnson It is certified that error appears in the above-identified patent and that said Letters Patent is hereby corrected as shown below:

In column 3, line 67, delete "("*_dbg$_{link}$_ctl")" and insert -- ("*_dbg_link_ctl") --, therefor.

Signed and Sealed this

Twenty-eighth Day of July, 2009

JOHN DOLL
*Acting Director of the United States Patent and Trademark Office*